United States Patent
Voutsas et al.

(10) Patent No.: US 7,046,715 B2
(45) Date of Patent: May 16, 2006

(54) METHOD FOR SUPPRESSING ENERGY SPIKES OF A PARTIALLY-COHERENT BEAM USING TRIANGULAR END-REGIONS

(75) Inventors: Apostolos T. Voutsas, Vancouver, WA (US); Mark A. Crowder, Portland, OR (US); Yasuhiro Mitiani, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 68 days.

(21) Appl. No.: 10/883,381

(22) Filed: Jul. 1, 2004

(65) Prior Publication Data

US 2004/0238502 A1 Dec. 2, 2004

Related U.S. Application Data

(62) Division of application No. 10/113,144, filed on Mar. 27, 2002, now Pat. No. 6,792,029.

(51) Int. Cl.
*H01S 3/00* (2006.01)
*H01S 3/08* (2006.01)
*G03F 1/00* (2006.01)

(52) U.S. Cl. .......................... 372/109; 372/103; 430/5
(58) Field of Classification Search .................. 372/92, 372/103, 109; 430/5
See application file for complete search history.

(56) References Cited

U.S. PATENT DOCUMENTS

| 5,119,113 | A | * | 6/1992 | Prakash et al. ............. 347/241 |
| 5,670,281 | A | * | 9/1997 | Dai ................................. 430/5 |
| 5,729,331 | A | * | 3/1998 | Tanaka et al. ................ 355/53 |
| 5,759,723 | A | * | 6/1998 | Han ................................ 430/5 |
| 5,982,806 | A | * | 11/1999 | Yamaguchi et al. ......... 372/103 |
| 6,033,811 | A | * | 3/2000 | Lee ................................ 430/5 |
| 6,194,104 | B1 | * | 2/2001 | Hsu ............................... 430/5 |
| 6,214,494 | B1 | * | 4/2001 | Bula et al. ..................... 430/5 |
| 6,368,516 | B1 | * | 4/2002 | Carpi et al. ................... 216/41 |
| 6,635,392 | B1 | * | 10/2003 | Okada et al. .................. 430/5 |
| 6,803,155 | B1 | * | 10/2004 | Dulman et al. ............... 430/5 |
| 2001/0052966 | A1 | * | 12/2001 | Fujitsuka et al. ............. 355/53 |
| 2005/0074677 | A1 | * | 4/2005 | Laidig et al. .................. 430/5 |
| 2005/0139788 | A1 | * | 6/2005 | You ....................... 250/492.22 |
| 2005/0142450 | A1 | * | 6/2005 | Jung .............................. 430/5 |
| 2005/0142452 | A1 | * | 6/2005 | You ............................... 430/5 |
| 2005/0142453 | A1 | * | 6/2005 | Seo et al. ....................... 430/5 |
| 2005/0176189 | A1 | * | 8/2005 | Cho ............................. 438/166 |
| 2005/0271952 | A1 | * | 12/2005 | Jung .............................. 430/5 |

FOREIGN PATENT DOCUMENTS

JP 57192028 A * 11/1982

* cited by examiner

*Primary Examiner*—Hoang V. Nguyen
*Assistant Examiner*—Leith A. Al-Nazer
(74) *Attorney, Agent, or Firm*—Law Office of Gerald Maliszewski; Gerald Maliszewski

(57) ABSTRACT

Accordingly, a method of suppressing energy spikes is provided comprising projecting a laser beam through a mask having a slit pattern comprising a corner region with edges, and a blocking feature with the corner region to reduce energy spikes projected on a substrate. An alternative method is provided, wherein the corner region is modified such that it is replaced by a more tapered shaped region, preferably a triangle. Also provided, are a variety of mask designs incorporating both corner regions, with and without one or more blocking features, and triangular regions, with or without one or more blocking features. The mask designs provide examples of mask modifications that may be used to reduce energy spikes.

13 Claims, 6 Drawing Sheets

Fig. 20
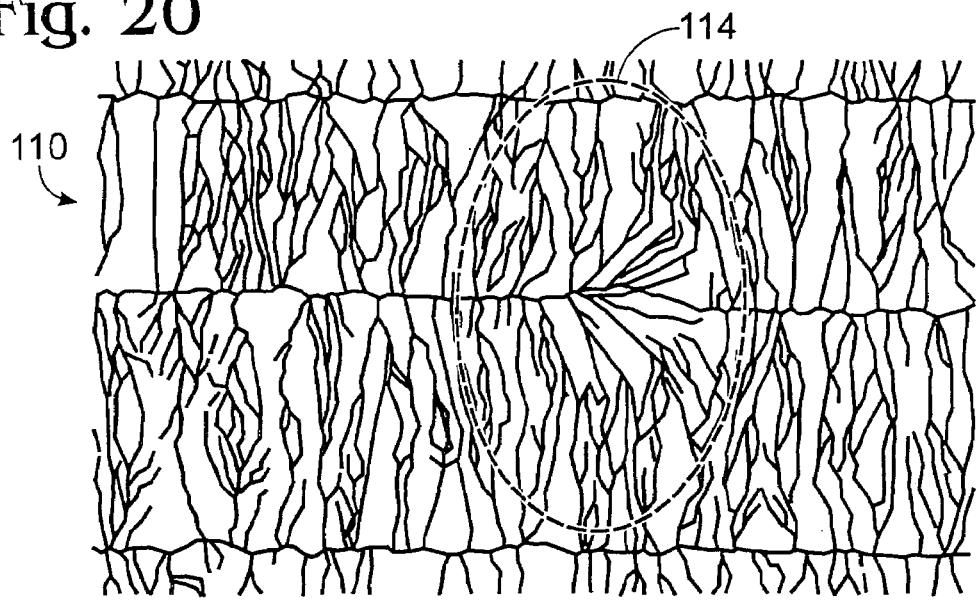
Fig. 21
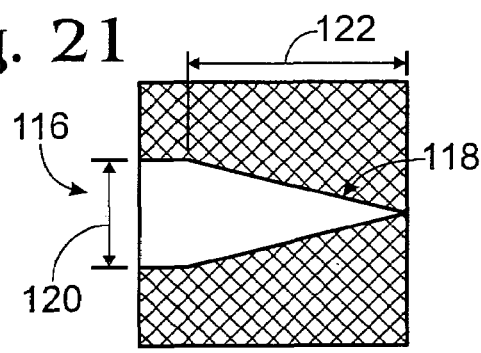
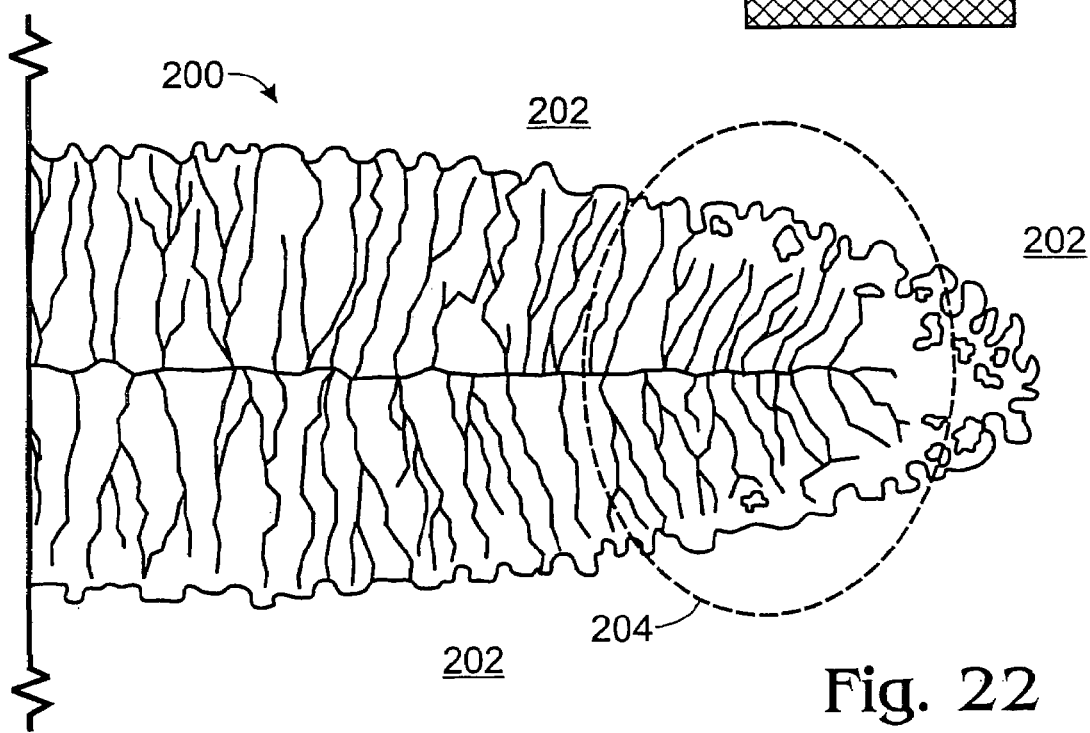
Fig. 22

US 7,046,715 B2

METHOD FOR SUPPRESSING ENERGY SPIKES OF A PARTIALLY-COHERENT BEAM USING TRIANGULAR END-REGIONS

CROSS-REFERENCE

This application is a divisional of application Ser. No. 10/113,144, filed Mar. 27, 2002, entitled "Method for Suppressing Energy Spikes of a Partially-Coherent Beam," invented by Apostolos T. Voutsas, Mark Albert Crowder, and Yasuhiro Mitani now U.S. Patent No. 6,792,029, which is hereby incorporated by reference.

BACKGROUND OF THE INVENTION

A laser beam is used in laser-annealing applications to crystallize an amorphous material to obtain a crystalline, or polycrystalline, material. For example, excimer lasers may be used to crystallize an amorphous silicon (a-Si) film to obtain a polycrystalline silicon (poly-Si) region. In several of these methods, a mask is inserted into the path of the beam to shape the laser beam before the beam irradiates the material.

The mask, used to shape the beam, can in principal have a wide variety of patterns on it. The mask may comprise a patterned layer of chrome, or other material that blocks the desired wavelength effectively, on a quartz substrate, or other suitably transparent material at the wavelength of laser to be used. Common patterns consist of groups of rectangular shapes, including slits and chevrons.

As the laser beam is projected through these patterns, the intensity profile of the projected beam will be determined by the features that make up the pattern and any optics used to image the pattern on the material. The intensity profile of the laser beam is typically not uniform over the entire pattern. For example, at corner regions intensity peaks have been noticed. These intensity peaks may cause local damage on the film irradiated by the shaped beam. One form of damage caused by intensity peaks is agglomeration, which may cause the silicon film to pull away from the region exposed to the high intensity peaks, possibly leaving a void or other non-uniformity.

SUMMARY OF THE INVENTION

Accordingly, a method of suppressing energy spikes is provided comprising projecting a laser beam through a mask having a slit pattern comprising a corner region with edges, and a blocking feature with the corner region to reduce energy spikes projected on a substrate. An alternative method is provided, wherein the corner region is modified such that it is replaced by a more tapered shaped region, preferably a triangle.

Also provided, are a variety of mask designs incorporating both corner regions, with and without one or more blocking features, and triangular regions, with or without one or more blocking features. The mask designs provide examples of mask modifications that may be used to reduce energy spikes.

BRIEF DESCRIPTION OF THE DRAWINGS

FIG. 20 shows a region following a two-pass laser annealing process using masks similar to that shown in FIG. 6.

FIG. 21 is a plane view showing a portion of a mask pattern.

FIG. 22 shows a region following laser annealing using a mask similar to that shown in FIG. 21.

DETAILED DESCRIPTION OF THE INVENTION

Figure 1:
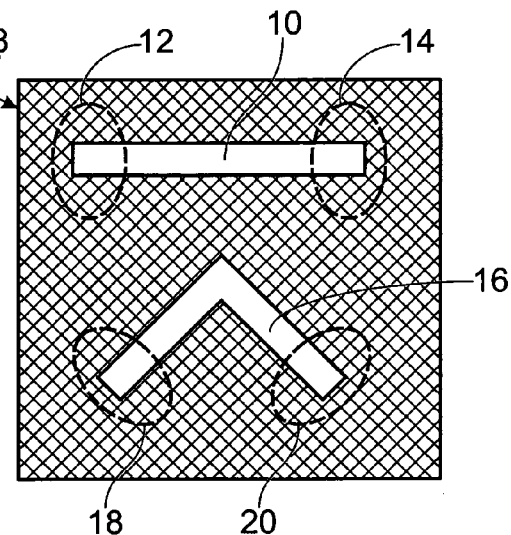
FIG. 1 is a plane view showing two prior art mask patterns

FIG. 1 shows a mask 8 with two examples of common mask patterns used in connection with laser annealing processes. A slit 10 has a first corner region 12 and a second corner region 14, as indicated by the dotted ellipses. A chevron 16 also has corner regions 18 and 20, as indicated by the dotted ellipses. It is in the vicinity of corner regions, that intensity spikes have been notice when a laser beam is projected through the mask 8 onto a substrate to be laser annealed. The laser beam may pass through a variety of projection optics either before or after passing through the mask 8.

Figure 2:
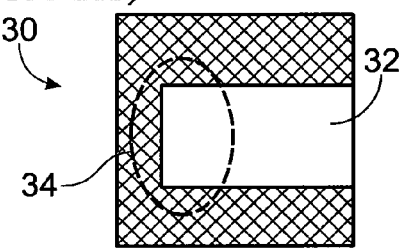
FIG. 2 is a plane view showing a portion of a mask pattern.

FIG. 2 illustrates a portion 30 of a prior art mask pattern for use in laser annealing processes. The portion 30 includes a slit 32 with a corner region 34. The slit 32 is essentially transparent at the desired wavelength across its entire area. Transparent refers to an area with no opaque pattern within the slit, even through there may be slight attenuation from the quartz or other substrate that the pattern has been formed on. The slit 32 as shown has a width of between approximately 4 and 5 micrometers wide. However, the width of the slit is only limited by the lateral crystal growth length. For example, the slit width could be in the range of between approximately 2 and 20 micrometers.

Figure 3:
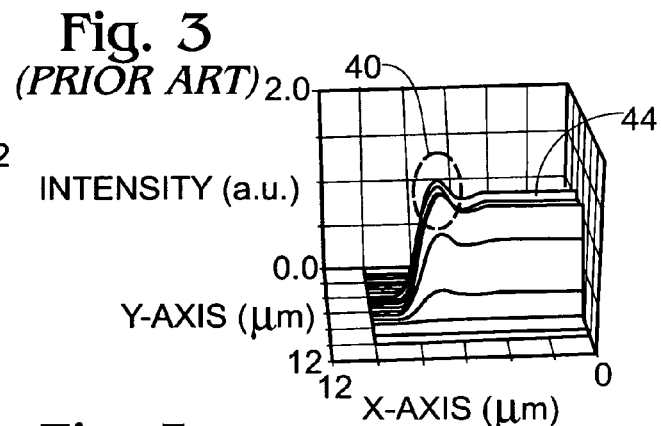
FIG. 3 is a 3D intensity distribution plot corresponding to the mask pattern of FIG. 2.

FIG. 3 is a laser intensity distribution plot for the slit 32 shown in FIG. 2. The intensity distribution depends upon the numerical aperture (NA) of any projection system used to image the laser beam that passes through the slit 32 onto the material to be crystallized. The intensity distribution shown in FIG. 3 is based on a projection system with a numerical aperture of 0.13. The intensity distribution becomes more intense in the region at the end of the corner region. An intensity peak 40 is clearly visible on this intensity plot. The intensity peak 40 produces undesirable material uniformity effects. The problems associated with the intensity peak 40 are further compounded when scanning laser annealing processes are used as the corner regions may pass over areas of material that have already been exposed to corner regions from previous passes. This may contribute to additional damage from successive intensity peaks passing over the same region of material. Elimination of the intensity peak will reduce, or eliminate, damage to the crystallized materials, including agglomeration, and other material non-uniformity effects, caused by the intensity peak.

Therefore, it would be desirable to have a mask design and corresponding process that suppresses the corner effect and allows for uniform, crystallized material to be generated upon laser irradiation.

Several families of designs were considered to modify the corner region to reduce, or eliminate, the intensity peak. A first family of designs maintains the outline of the slit, but incorporates beam blocking features in the vicinity of the corner region. A second family of designs modified the outline of the slit to form a triangular region in place of the corner region, both with and without beam blocking features. Another family of designs modified the outline of the slit by using a stepped triangular region in place of the corner region, along with the possible addition of blocking features.

Examples 1 through 7 are based on rectangular slits that are either four, or four and a half, micrometers wide projected onto a material using a projection system with a numerical aperture of 0.13 so that the resulting intensity distributions can be compared with those corresponding to an unmodified slit as described in connection with FIGS. 2 and 3.

The dimensions provided here are illustrative as the critical dimensions and spacing of blocking features depend on the projection system to be used.

EXAMPLE 1

Figure 4:
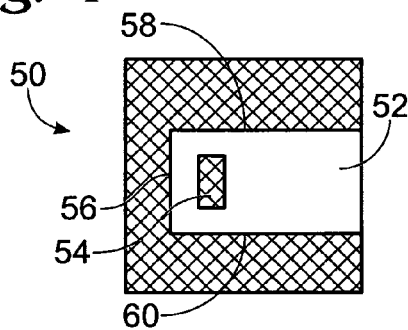
FIG. 4 is a plane view showing a portion of a mask pattern.

Referring now to FIG. 4, a portion of a mask 50 is shown. The mask 50 has a slit 52 with a blocking feature 54. For example, the slit 52 has an end 56 along with a first side 58 and an opposite side 60. The slit is four micrometers wide measured from the first side 58 to the opposite side 60. The blocking feature 54, as shown, is one micrometer wide, across its narrowest dimension, one micrometer from the end 56, and one micrometer from either side 58 or 60.

Figure 5:
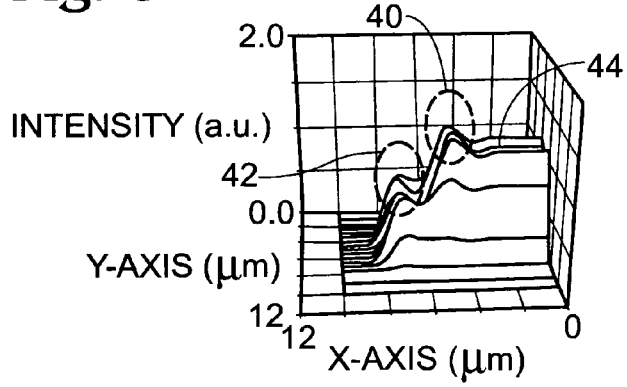
FIG. 5 is a 3D intensity distribution plot corresponding to the mask pattern of FIG. 4.

FIG. 5 shows an intensity distribution corresponding to the mask 50, shown in FIG. 4. The intensity peak 40 has been shifted away from the end of the slit. A secondary peak 42 is also shown. The secondary peak 42 is well below the baseline intensity, shown at 44. By shifting the intensity peak 40 away from the end of the slit, it may be possible to reduce material damage associated with successive scan exposures, since there is less chance of the intensity peaks overlapping. However, the intensity peak may still damage crystallized material during a single pass.

EXAMPLE 2

Figure 6:
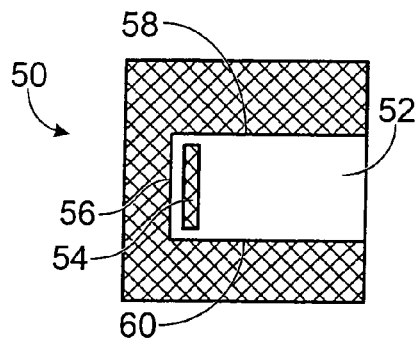
FIG. 6 is a plane view showing a portion of a mask pattern.

FIG. 6 shows another example of the mask 50 with the blocking feature 54 positioned toward the end 56 of a slit 52. As shown the slit 52 is 4 micrometers wide. The blocking feature 54 is approximately one half micrometer wide and positioned approximately one half micrometer from the end 56 and from either side 58 or 60.

Figure 7:
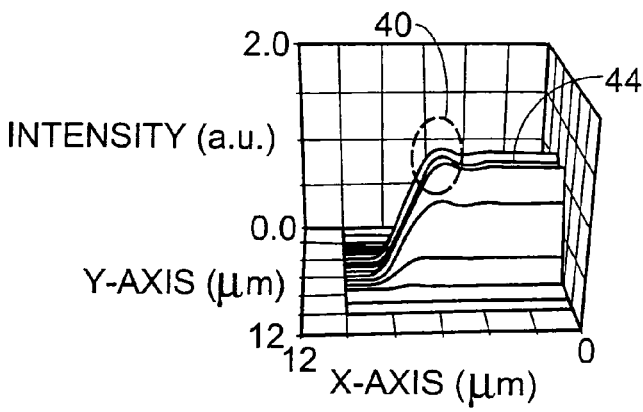
FIG. 7 is a 3D intensity distribution plot corresponding to the mask pattern of FIG. 6.

FIG. 7 shows an intensity distribution corresponding to the mask 50, shown in FIG. 6. The intensity peak 40 has been shifted slightly away from the end of the slit. The intensity peak 40 is significantly reduced, although still identifiable.

EXAMPLE 3

Figure 8:
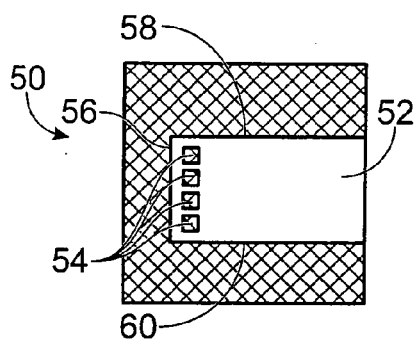
FIG. 8 is a plane view showing a portion of a mask pattern.

FIG. 8 shows another example of the mask 50. In this example multiple blocking features 54 are used. As shown, the slit 52 is 4.5 micrometers wide. The blocking features 54 are squares with sides approximately one half micrometer long. Each blocking feature is separated from the next by a half micrometer space. There is also a half micrometer space from the end of the slit 52 to the blocking features, as well as between either side 58 and 60 and the nearest of the blocking features 54.

Figure 9:
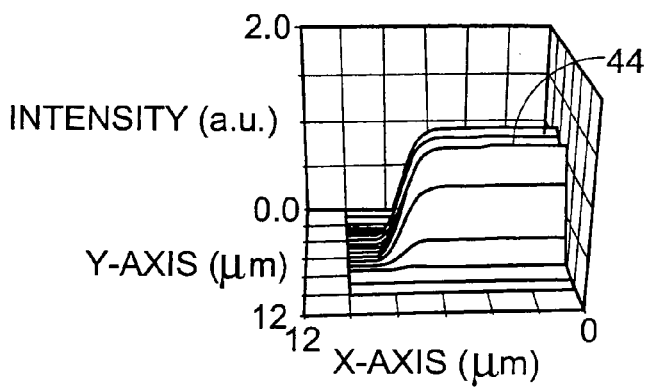
FIG. 9 is a 3D intensity distribution plot corresponding to the mask pattern of FIG. 8.

FIG. 9 shows an intensity distribution corresponding to the mask 50, as shown in FIG. 8. There is no longer an identifiable intensity peak. The intensity distribution is essentially flat across the slit region. The edge of the intensity distribution appears to have shifted only slightly from the end of the slit.

EXAMPLE 4

Figure 10:
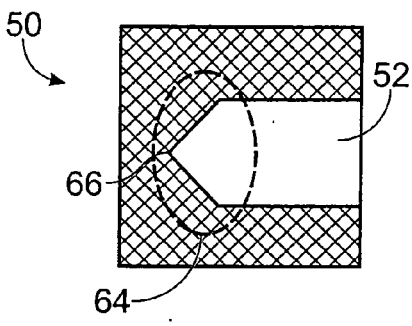
FIG. 10 is a plane view showing a portion of a mask pattern

FIG. 10 provides another example of the mask 50. The corner region of the slit 52 has been modified. The rectangular corner region has been replaced by a triangular end region 64. The triangular end region may be patterned, as shown, so that the triangular end region corresponds to a triangle having an apex 66 at the position corresponding to the middle of the end of the corner region of the corresponding rectangular slit. As shown the width of the rectangular region is approximately four micrometers, which corresponds to the base of the triangular region.

Figure 11:
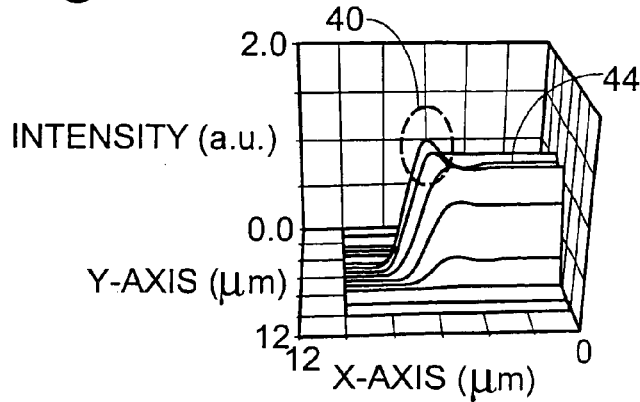
FIG. 11 is a 3D intensity distribution plot corresponding to the mask pattern of FIG. 10.

FIG. 11 shows an intensity distribution corresponding to the mask 50, shown in FIG. 10. The intensity peak 40 has essentially the same magnitude at the peak, as the intensity peak shown in FIG. 3. The intensity peak 40 is not as wide, however, as it tapers off at an angle along the edges corresponding to the sides of the triangular region of the slit 52.

EXAMPLE 5

Figure 12:
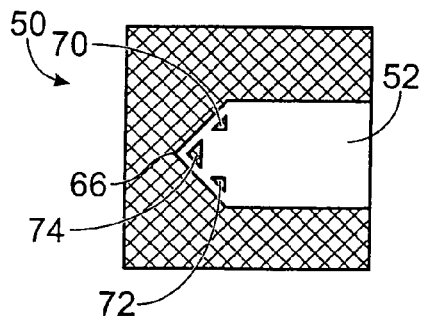
FIG. 12 is a plane view showing a portion of a mask pattern.

A modified version of Example 4 is provided in FIG. 12. Blocking features 70, 72, and 74 have been added to the triangular end region. The blocking features, as shown, consist of two small triangles 70 and 72, which are right triangles with sides that are approximately one half micrometer each. Each small triangle 70 and 72 is positioned such that one of its sides is approximately one half micrometer from the edge of the triangular end region of the slit 52. The side may be substantially parallel to the slit edge, as shown. A third blocking feature 74 is a right triangle with a hypotenuse that is one micrometer long. The third blocking feature 74 has a right angle positioned approximately one half micrometer from the apex 66 of the triangular region.

Figure 13:
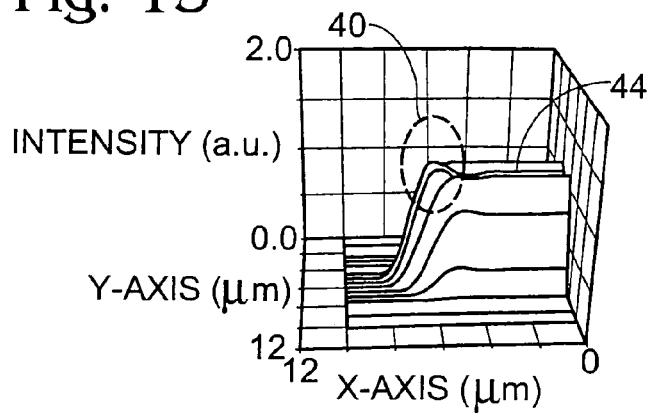
FIG. 13 is a 3D intensity distribution plot corresponding to the mask pattern of FIG. 12.

FIG. 13 shows an intensity distribution corresponding to the mask 50, shown in FIG. 12. The intensity peak 40 has been significantly reduced, although still identifiable. The intensity distribution is sufficiently flat for purposes of laser crystallization processes, and should not induce significant damage.

EXAMPLE 6

Figure 14:
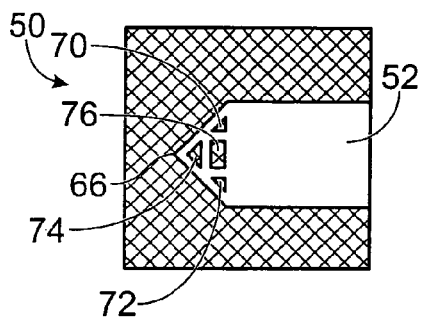
FIG. 14 is a plane view showing a portion of a mask pattern.

Further modification of Example 5, is shown in FIG. 14. A rectangular blocking feature 76 has been added adjacent to the three triangular blocking features 70, 72, and 74, such that it is approximately one half micrometer from each of the triangular blocking features. As shown, the rectangular blocking feature is approximately one half micrometer wide and one micrometer in length.

Figure 15:
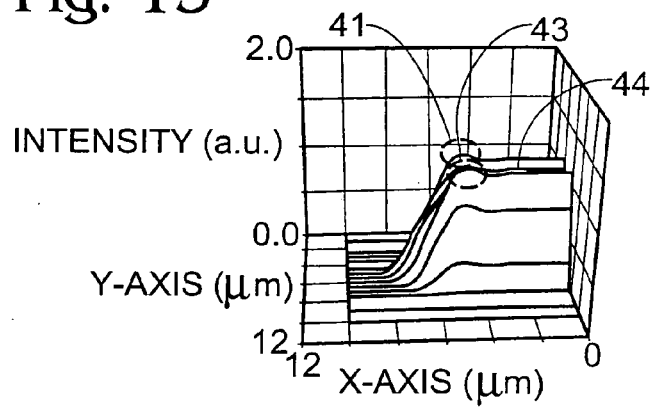
FIG. 15 is a 3D intensity distribution plot corresponding to the mask pattern of FIG. 14.

FIG. 15 shows an intensity distribution corresponding to the mask 50, shown in FIG. 14. There are now two intensity peaks 41 and 43 identifiable. The intensity distribution is effectively flat for purposes of laser crystallization processes, and should not induce significant damage.

EXAMPLE 7

Figure 16:
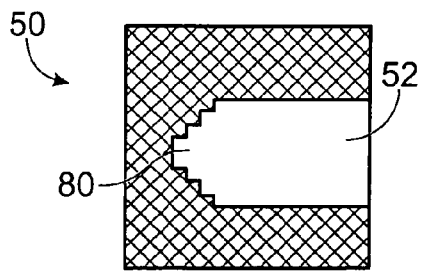
FIG. 16 is a plane view showing a portion of a mask pattern.

FIG. 16 shows another illustration of a modified corner region of a slit 52 on a mask 50. The corner region has been replaced by a stepped triangular feature. As shown, the triangular region has a tip region 80, which is one micrometer across at its apex 86, with square steps each having a one half micrometer rise and one half micrometer run. The width of the rectangular region of the slit 52, as shown, is four micrometers wide.

Figure 17:
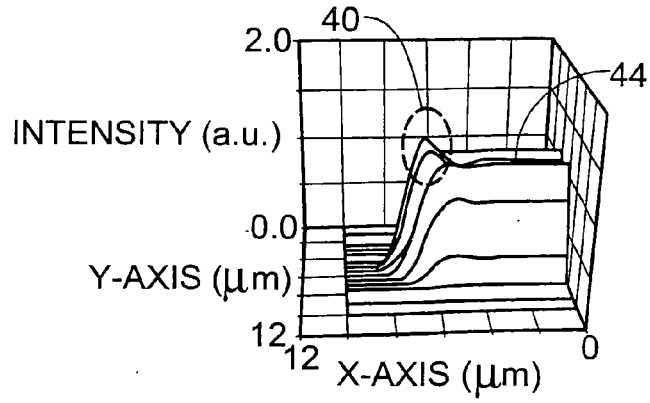
FIG. 17 is a 3D intensity distribution plot corresponding to the mask pattern of FIG. 16.

FIG. 17 shows an intensity distribution corresponding to the mask 50, shown in FIG. 16. The intensity peak 40 has essentially the same magnitude at the peak as that shown in FIG. 3. The intensity peak 40 is not as wide, however, as it tapers off at an angle along the edges corresponding to the sides of the triangular region of the slit 52. The intensity distribution appears to correspond very closely with that of FIG. 11, which corresponds to a triangular region. It is anticipated that the addition of blocking features would reduce the intensity peak. Either rectangular, square, triangular or other appropriate shapes could be used as blocking features. One or more blocking features could be added. Based upon the results of shown in FIGS. 7, 9, 13 and 15, blocking features approximately one half micrometer across may be appropriate.

The above results suggest that the addition of blocking features, in the vicinity of the corners, is one way to obtain a uniform intensity profile. The critical dimension of the blocking features depend primarily upon the resolution of the optical system that is used to image the mask onto the substrate. The resolution depends upon the numerical aperture (NA) of the optical system. The higher the NA; the higher the resolution will be (i.e. the optical system will be able to resolve finer features). In the intensity distributions shown above, a numerical aperture of 0.13 was used, corresponding to a resolution of approximately 1.6 to 2 micrometers. For this NA, the critical blocking feature dimension that optimizes the intensity profile is on the order of 0.35 to 0.7 micrometers. Further optimization may narrow the critical blocking feature dimension range to between approximately 0.4 and 0.6 micrometers, and as discussed above one half micrometer may be optimal.

Figure 18:
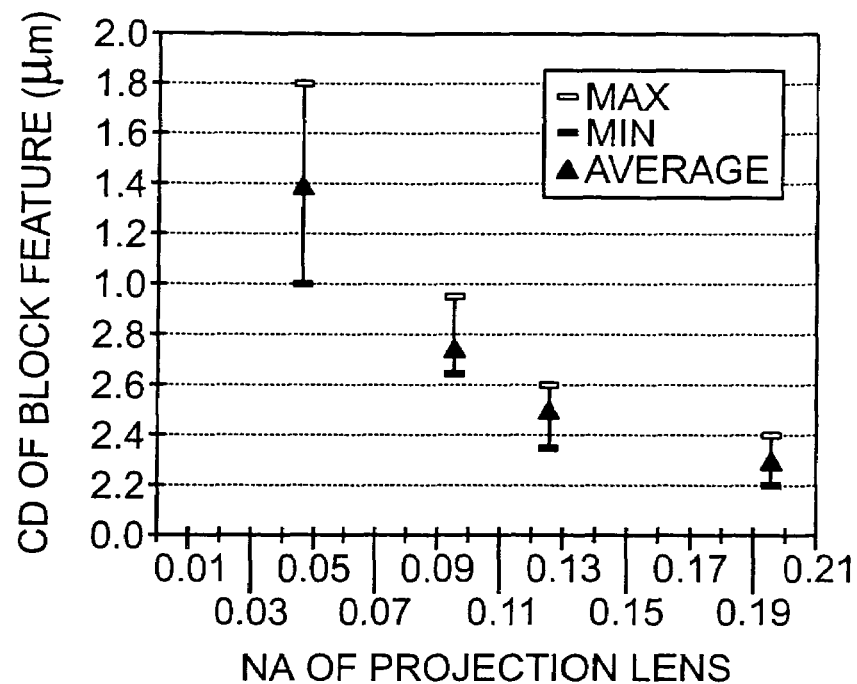
FIG. 18 is a plot of the critical dimension of blocking features related to the numerical aperture of the projection system.

As the NA of the optical system changes, the optimum blocking feature dimension-range will also change. Therefore, we can plot the optimum block dimension-range as a function of the NA of the imaging system. This plot is shown in FIG. 18, which shows the critical dimension of blocking features in micrometers as a function of the numerical aperture (NA) of the projection lens. The examples given above corresponded to an optical system with an NA of 0.13. The plot shows the critical dimensions of blocking features for projections lenses having both larger and smaller numerical apertures, than the NA of 0.13 used in the above examples.

Depending on the NA of the optical system, the critical dimension for the size, or width, of blocking features and the spaces between features and other portions of the slit will fall within a range. Although for ease of illustration a single value has been used for the both the blocking feature size and the space between blocking features in the above examples, it is possible for the sizes of the blocking features to be different from each other, and that the spaces between blocking features be different sizes than the features themselves. The term critical dimension corresponds to a range of sizes, and the features and spaces may have varying sizes, preferably the sizes, or widths, will be within the critical dimension range.

Figure 19:
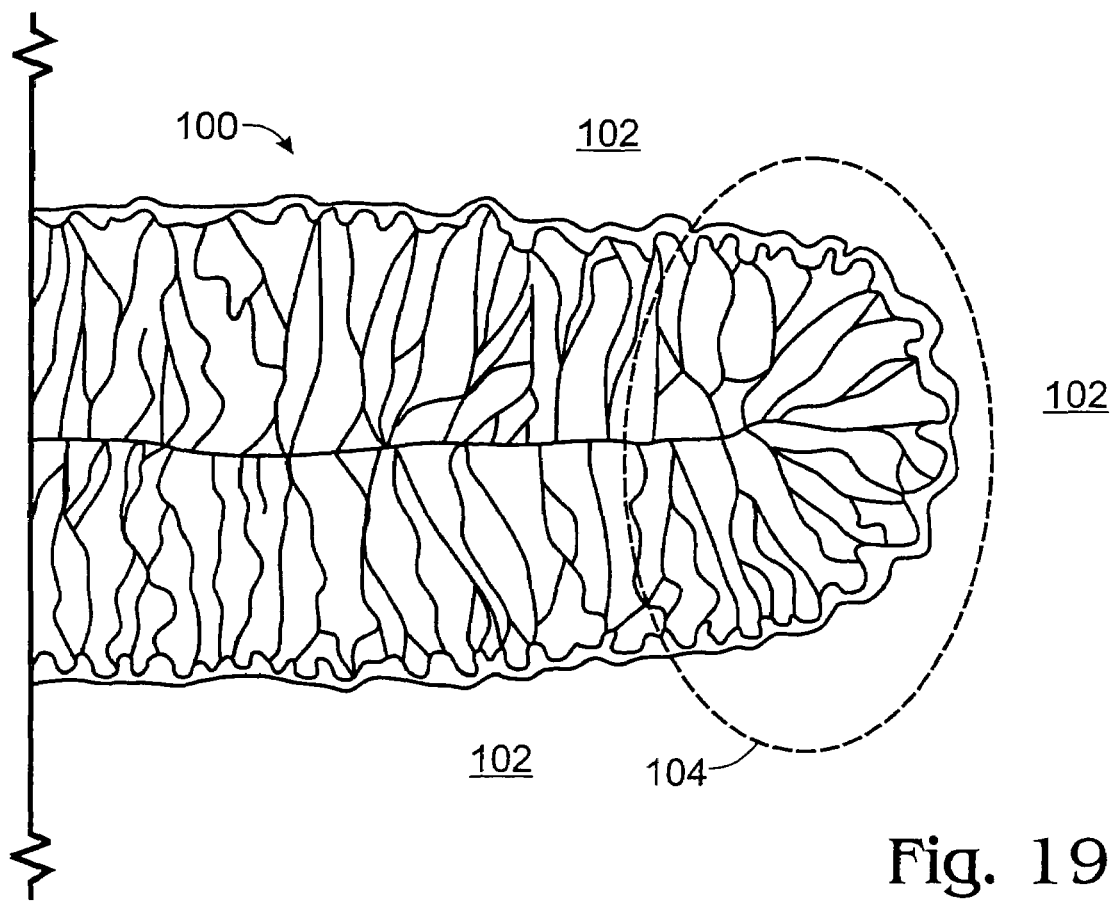
FIG. 19 shows a region following laser annealing using a mask similar to that shown in FIG. 6.

Referring now to FIG. 19, a polycrystalline region 100 is shown surrounded by an amorphous region 102. The polycrystalline region 100 was formed using a single laser pulse through a mask similar to that described in connection with FIG. 6. The use of the mask of FIG. 6 with a blocking feature has eliminated agglomeration. However, another unexpected crystalline non-uniformity is identifiable. In the end region identified at 104, a radial crystal pattern is clearly visible. The crystal pattern away from the end region is a more consistent, substantially parallel pattern.

Referring now to FIG. 20, a polycrystalline region 110 is shown after completing a multi-pass laser annealing scan using the same mask as that used in connection with FIG. 19. The region 114, which corresponds to overlapping end regions, still shows the less desirable radial crystal pattern. Although, a radial crystal pattern is preferable to damage such as that caused by agglomeration, in a preferred embodiment it would be desirable to also reduce, or eliminate, the radial crystal regions.

FIG. 21 illustrates a mask pattern 116 with a triangular end region 118. The triangular end region 118 has a base 120 and a length 122, that form the basis of the aspect ratio of the triangular end region. The aspect ratio is the ratio of the length 122 to the base 120. The aspect ratio of the triangular end region is in the range between one half and five. One preferred range of aspect ratios is between two and four. The aspect ratio of the embodiment shown in FIG. 21 is approximately three.

FIG. 22 shows a polycrystalline region 200 surrounded by an amorphous region 202. The polycrystalline region 200 was formed using a single laser pulse through a mask similar to that described in connection with FIG. 21. In the end region identified at 204, the radial crystal pattern has been reduced or eliminated. On close inspection of the end region identified at 204, a slight fishbone pattern can be seen. This fishbone pattern is closer to the more desirable substantially parallel pattern found outside the end region.

Figure 23:
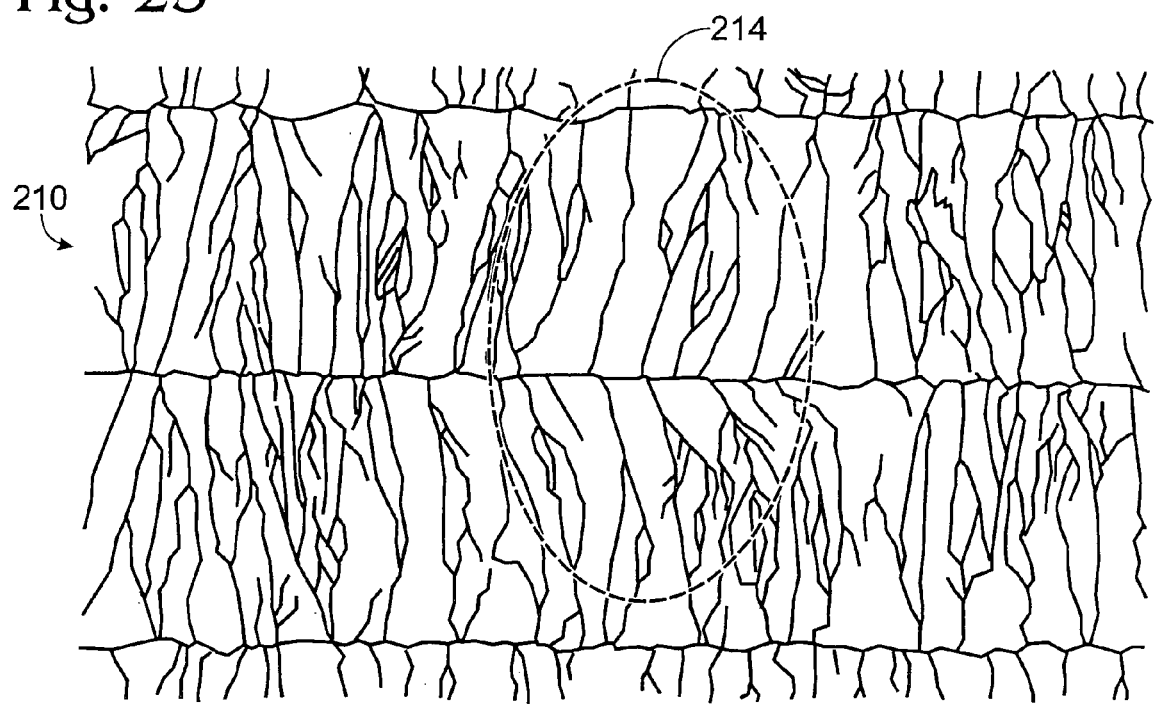
FIG. 23 shows a region following a two-pass laser annealing process using masks similar to that shown in FIG. 21.

Referring now to FIG. 23, a polycrystalline region 210 is shown after completing a multi-pass laser annealing scan using the same mask as that used in connection with FIG. 22.

The region 214, which corresponds to the overlapping end region, no longer shows a radial crystal pattern. In addition, there is not even a clearly discernable fishbone crystal pattern. The resulting material appears to be substantially parallel throughout the crystallized region.

Figure 24:
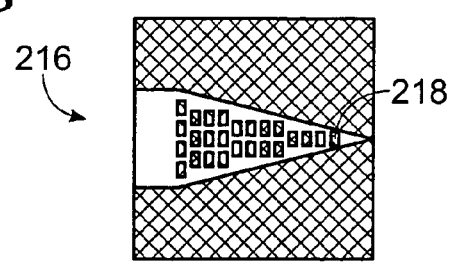
FIG. 24 is a plane view of a portion of a mask pattern similar to that shown in FIG. 21 with the addition of blocking features.

FIG. 24 illustrates a mask pattern 216 which has a triangular end region similar to that shown in FIG. 21. Additional blocking features 218 have been added to provide additional control over beam intensity to further reduce, or eliminate, energy spikes. Although FIG. 24, as well as FIG. 21, are shown as straight-sided triangles, it would also be possible to use stepped triangles instead.

What is claimed is:

1. A method of suppressing energy spikes comprising:
   projecting a laser beam through a mask having a slit pattern comprising a rectangular region and a triangular end region formed as a stepped triangle;
   transmitting light with a first intensity through the rectangular region;
   transmitting light with a maximum intensity about equal to the first intensity, through the triangular end region; and,
   annealing a substrate surface in response to the transmitted light.

2. The method of claim 1, wherein the triangular end region has an aspect ratio of between one half and five.

3. The method of claim 1, further comprising blocking features for reducing energy spikes positioned within the triangular end region.

4. A laser annealing mask, with a pattern for suppressing energy spikes, the mask comprising:
   a rectangular portion for laser annealing an underlying area of substrate with a first intensity of light; and,
   a stepped triangular end region with edges, a base adjacent the rectangular portion, and an apex, for laser annealing an area of substrate with a maximum intensity about equal to the first intensity underlying the base, and tapering to an intensity of about zero underlying the apex.

5. The mask of claim 4, wherein the triangular end region has an aspect ratio in the range of between approximately one half and five.

6. The mask of claim 4, wherein the triangular end region has an aspect ratio in the range of between approximately two and four.

7. The mask of claim 4, wherein the triangular end region has an aspect ratio of approximately three.

8. The mask of claim 4, further comprising a blocking feature positioned within the triangular end region.

9. The mask of claim 8, wherein the blocking feature comprises multiple shapes a critical dimension wide and positioned the critical dimension from each other and the critical dimension from any edges of the triangular end region.

10. A method of suppressing energy spikes comprising projecting a laser beam through a mask having a slit pattern comprising a triangular end region with blocking features, for reducing energy spikes, positioned within the triangular end region.

11. A method of suppressing energy spikes comprising projecting a laser beam through a mask having a slit pattern comprising a stepped triangular end region.

12. A mask for suppressing energy spikes comprising a mask pattern with a rectangular portion, a triangular end region with edges, and a blocking feature positioned within the triangular end region.

13. A mask for suppressing energy spikes comprising a mask pattern with a rectangular portion and a stepped triangular end region with edges.

* * * * *